(12) United States Patent
Suzuki

(10) Patent No.: US 7,732,978 B2
(45) Date of Patent: Jun. 8, 2010

(54) PIEZOELECTRIC ELEMENT DRIVING CIRCUIT AND PUMP DEVICE

(75) Inventor: Masahiro Suzuki, Kanagawa (JP)

(73) Assignee: Sony Corporation, Tokyo (JP)

(*) Notice: Subject to any disclaimer, the term of this patent is extended or adjusted under 35 U.S.C. 154(b) by 127 days.

(21) Appl. No.: 12/220,007

(22) Filed: Jul. 21, 2008

(65) Prior Publication Data
US 2009/0045696 A1 Feb. 19, 2009

(30) Foreign Application Priority Data
Aug. 15, 2007 (JP) .................. P2007-211912

(51) Int. Cl.
*H01L 41/09* (2006.01)
(52) U.S. Cl. ........................ 310/317; 310/318
(58) Field of Classification Search .......... 310/317, 310/318
See application file for complete search history.

(56) References Cited

U.S. PATENT DOCUMENTS 6,791,239 B2 * 9/2004 Chou et al. ............... 310/318
6,943,785 B2 * 9/2005 Chou et al. ............... 345/204
7,525,234 B2 * 4/2009 Martin ...................... 310/317
2003/0164658 A1 * 9/2003 Saraf ......................... 310/317
2005/0225203 A1 * 10/2005 Chou ......................... 310/318

FOREIGN PATENT DOCUMENTS

JP          01-107681       4/1989
JP          02-149358       2/1992

* cited by examiner

*Primary Examiner*—Thomas M Dougherty
(74) *Attorney, Agent, or Firm*—Robert J. Depke; Rockey, Depke & Lyons, LLC

(57) ABSTRACT

A piezoelectric element driving circuit includes: a transformer; a switch circuit; a reactance element connected in parallel with the piezoelectric element on one of the primary side and the secondary side of the transformer, the reactance element forming a resonant circuit that performs parallel resonance at the driving frequency with a capacitance component in an equivalent circuit of the piezoelectric element and an inductance component of the transformer; a pulse generating circuit for generating a driving pulse for the switch circuit; and a duty ratio controlling circuit for being supplied with the driving pulse, limiting a duty ratio of the driving pulse such that a value of the driving voltage falls within a range equal to or lower than the specification voltage value on the load side, and outputting the driving pulse whose duty ratio is limited to the switch circuit.

4 Claims, 12 Drawing Sheets

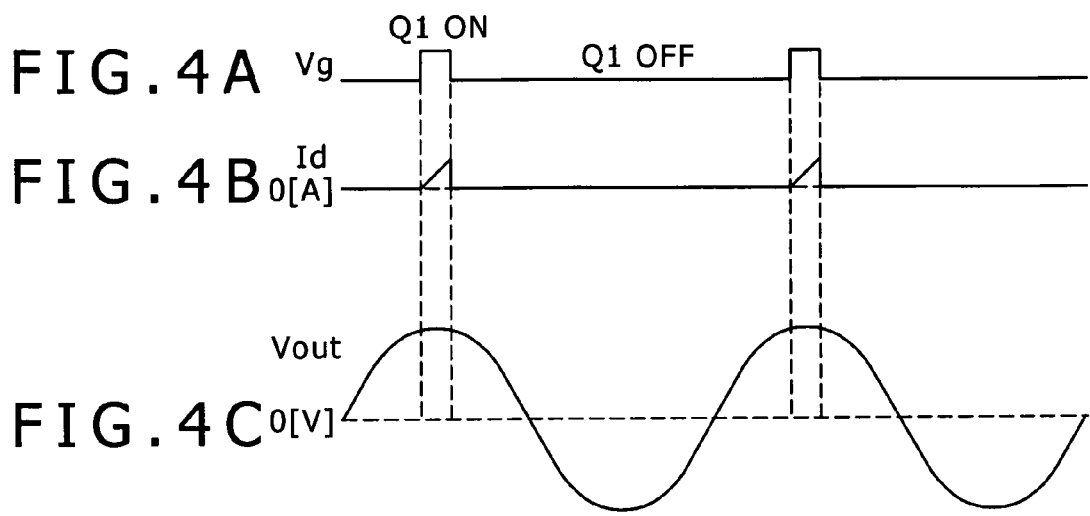
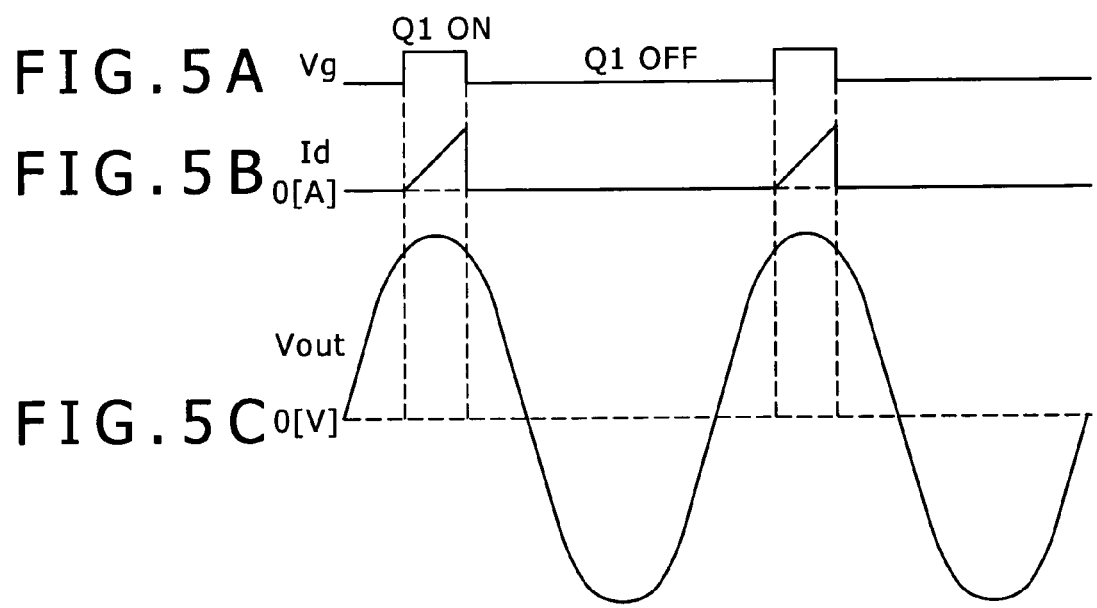

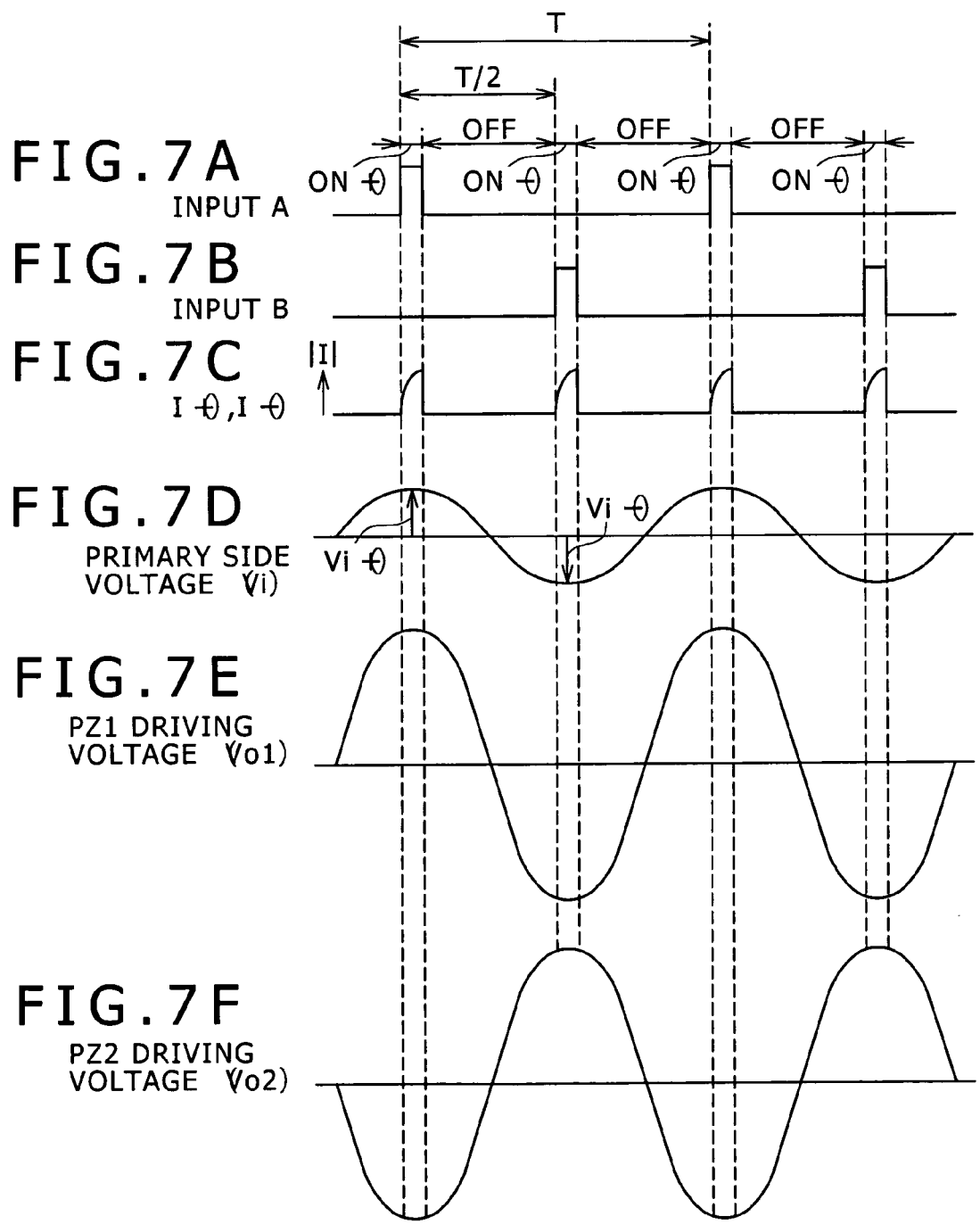

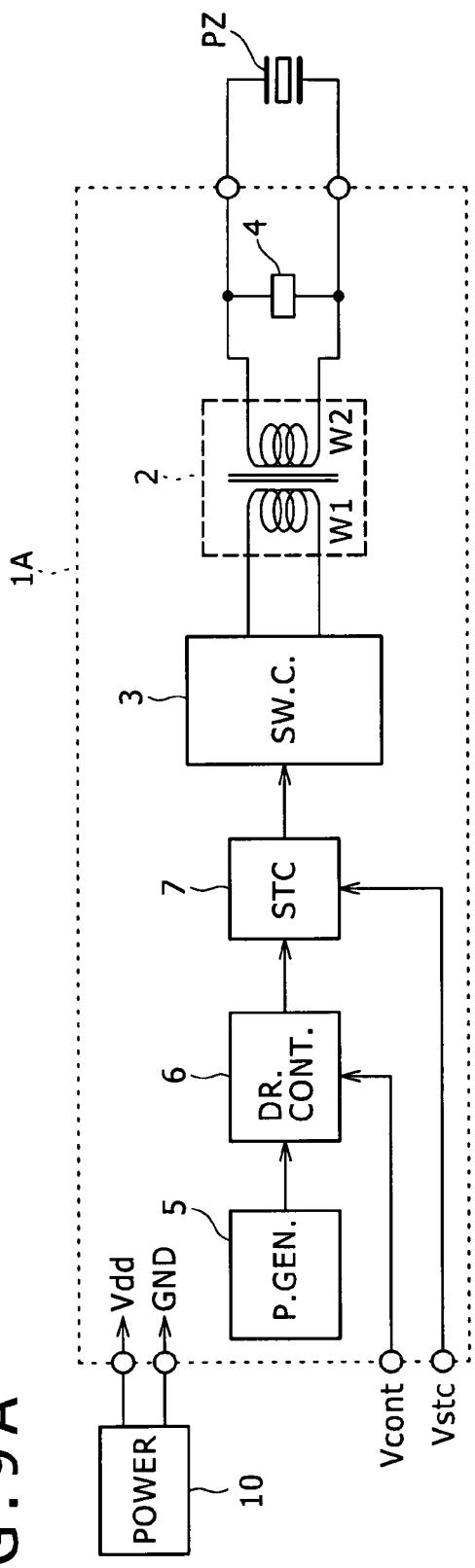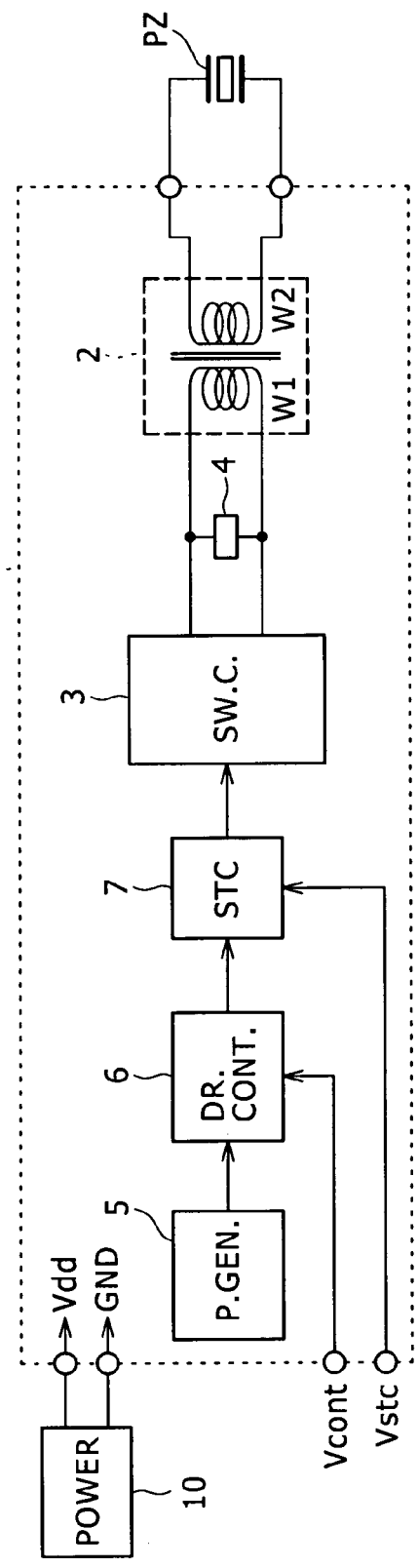

PIEZOELECTRIC ELEMENT DRIVING CIRCUIT AND PUMP DEVICE

CROSS REFERENCES TO RELATED APPLICATIONS

The present invention contains subject matter related to Japanese Patent Application JP 2007-211912 filed in the Japan Patent Office on Aug. 15, 2007, the entire contents of which being incorporated herein by reference.

BACKGROUND OF THE INVENTION

1. Field of the Invention

The present invention relates to a highly efficient piezoelectric element driving circuit that can vary driving voltage and consumes low power and a pump device that transfers a fluid by the vibration of a piezoelectric element.

2. Description of the Related Art

A piezoelectric element makes a mechanical movement according to an applied voltage because a piezoelectric material is bent when an electric field is applied to the piezoelectric material. Utilizing this characteristic of converting electric energy into kinetic energy, piezoelectric elements are widely applied to actuators, motors, and the like.

A driving circuit in which a resonant element such as a capacitor or the like forming a resonant circuit is connected to a primary side coil of a transformer, and primary side driving frequency is made variable is known as a driving circuit for a piezoelectric element of an oscillatory wave motor (see Japanese Patent Publication No. Hei 5-16277 (hereinafter referred to as Patent Document 1), for example).

A new actuator using a mode of coupled-vibration with a peripheral structure rather than a discrete piezoelectric element has recently been proposed. In such an actuator, a piezoelectric element and the peripheral structure vibrate in a mechanically coupled manner. Thus, behavior in the coupled-vibration mode at this time is complex. For example, rather than one electric resonance point, there are a plurality of frequency resonance points that are not in a simple high-order relation. In such an actuator, the Q-value of mechanical resonance frequency often becomes high. When driving frequency differs from mechanical resonance frequency of the actuator by 10%, for example, there occurs a phenomenon in which an amount of mechanical output produced by the actuator is decreased significantly.

In a case where the driving circuit described in the above-mentioned Patent Document 1, for example, is applied to such an actuator, when the driving frequency is changed for a purpose of changing mechanical output over a wide range, the driving frequency becomes different from the mechanical resonance frequency of the actuator, and thus mechanical output from the actuator becomes substantially zero.

It is necessary to use a driving circuit that controls the mechanical output of the actuator while operating at a frequency coinciding with the mechanical resonance frequency.

A method of combining a variable output voltage power supply with a driving circuit is conceivable for a purpose of controlling the mechanical output of the actuator at a fixed driving frequency. This method is also described in Patent Document 1. However, a variable output voltage power supply circuit on a relatively large circuit scale is necessary separately from a driving circuit.

A driving circuit is known in which a reactance element such as an inductor or the like forming a parallel resonant circuit together with a load (a piezoelectric element or a piezoelectric motor) on a secondary side of a transformer is provided, and driving frequency is stabilized by optimizing a constant of the reactance element so as to make the resonance frequency of the parallel resonant circuit coincide with the driving frequency (see Japanese Patent No. 2976489 (hereinafter referred to as Patent Document 2), for example).

In the driving circuit described in the above-mentioned Patent Document 2, because the driving frequency is determined by the parallel resonant circuit on the secondary side of the transformer, a switch circuit on a primary side has only a function of regularly performing boosting operation for secondary side voltage and supplying energy. Patent Document 2 discloses a switch circuit that applies a power supply voltage to a midpoint of a primary winding of the transformer and that alternately grounds both ends of the primary winding in order to realize a zero cross waveform of the secondary side voltage.

In the driving circuit disclosed in Patent Document 2, there is a need for suppressing a harmonic component due to a ripple and reducing a loss by making a boosted voltage generated on the secondary side of the transformer a regular sine wave.

Therefore, in the driving circuit described in the above Patent Document 2, power supply of the primary side of the transformer is performed via an inductance element, and the inductance element and a parallel capacitance in an equivalent circuit of an ultrasonic motor as a load are made to perform parallel resonance so that the parallel capacitance is apparently cancelled.

The driving circuit having such a configuration and operation can remove a ripple and reduce a loss, and also makes it possible to set the driving duty ratio of a switching element connected to the primary side of the transformer at a simple 50%.

SUMMARY OF THE INVENTION

However, in a driving circuit in which the driving duty ratio of a switching element is fixed, such as the driving circuit described in the above Patent Document 2, driving voltage for the piezoelectric element may not be varied, and input power for the piezoelectric element may not be varied, unless a variable voltage power supply is provided outside the circuit.

For example a fluid pump device using a piezoelectric element may need to control an amount of fluid being transferred. At this time, it is necessary to change input power for the piezoelectric element.

On the other hand, the application of the actuator using the piezoelectric element is expected to be widened to not only uses in conventional stationary devices but also uses in portable devices. At this time, power saving and miniaturization of the driving circuit also become important factors.

In the known techniques of Patent Document 2, a variable inductance element forming a resonant circuit together with a piezoelectric element is provided, and a control is disclosed which control changes the duty ratio of a pulse signal for driving the switching element with an intention of optimizing the resonance frequency of the resonant circuit. However, when the driving duty ratio is thus determined, the optimum value of the driving duty ratio is not a value for reducing power consumption, and the power consumption of the driving circuit is high.

It is desirable to realize a driving circuit that can change input power for a piezoelectric element and consumes low power. It is also desirable to realize a fluid pump device including the driving circuit.

A piezoelectric element driving circuit according to an embodiment of the present invention includes a transformer, a switch circuit, a reactance element, a pulse generating circuit, and a duty ratio controlling circuit.

The transformer has a turns ratio at which a rate of a number of turns of a secondary winding on a load side is high with respect to a number of turns of a primary winding on a power supply side, exceeding a ratio of a power supply side voltage value to a specification voltage value on the load side.

The switch circuit performs switching operation on power supply voltage at a driving frequency on a primary side of the transformer to apply a driving voltage to a piezoelectric element connected to a secondary side of the transformer.

The transformer has a primary side winding circuit and a secondary side winding circuit. The transformer transforms a voltage input to the primary side winding circuit as a result of the switching operation of the switch circuit, and outputs the transformed voltage to the secondary side winding circuit. When the switch circuit is in an off operation, an inductance component when the transformer is viewed from the side of the secondary side winding circuit forms a resonant circuit at a time of resonant operation.

The reactance element is connected in parallel with the piezoelectric element on the secondary side of the transformer. The reactance element forms the resonant circuit that performs parallel resonance at the driving frequency with a capacitance component in an equivalent circuit of the piezoelectric element and the inductance component of the transformer.

The pulse generating circuit generates and outputs a driving pulse at a frequency equal to resonance frequency, for example.

The duty ratio controlling circuit is supplied with the driving pulse from the pulse generating circuit. The duty ratio controlling circuit limits the duty ratio of the driving pulse according to, for example, a voltage controlling signal input to the duty ratio controlling circuit such that the value of the driving voltage falls within a range equal to or lower than the specification voltage value on the load side. The duty ratio controlling circuit outputs the driving pulse whose duty ratio is limited to the switch circuit.

According to the piezoelectric element driving circuit of such a constitution, the switch circuit drives the power supply voltage at the driving frequency on the primary side of the transformer. Therefore, the driving voltage having a magnitude corresponding to the turns ratio of the transformer is applied to the piezoelectric element connected to the secondary side of the transformer.

At this time, the resonant circuit formed by the reactance element connected in parallel with the piezoelectric element on the secondary side of the transformer, the capacitance component of the piezoelectric element, and the inductance component of the transformer performs parallel resonance at the driving frequency. The switch circuit performs switching operation to change potential on the secondary side of the transformer to a predetermined potential.

The driving voltage for the piezoelectric element is originally increased according to the turns ratio of the transformer. In the present invention, the turns ratio is set such that the rate of the number of turns of the secondary winding is higher, exceeding the ratio between the power supply side voltage value and the specification voltage value on the load side. Hence, even when the duty ratio controlling circuit lowers the duty ratio of the driving pulse, the amplitude of the driving voltage necessary for the piezoelectric element can be maintained. On the other hand, the power consumed by the switch circuit is a time average of power consumed during times that the driving pulse is on. Therefore, when the duty ratio of the driving pulse becomes relatively low, the power consumed by the switch circuit is correspondingly reduced.

A pump device according to an embodiment of the present invention includes: a pump having a pump chamber one side of which is sealed by one of a piezoelectric material of a piezoelectric element and a vibrating member vibrating together with the piezoelectric material, the pump discharging, from a discharge opening, a fluid sucked in from a fluid suction opening of the pump chamber; and a driving circuit for vibrating and driving the piezoelectric element of the pump. As in the above-described embodiment of the present invention, the driving circuit includes a transformer, a switch circuit, a reactance element, a pulse generating circuit, and a duty ratio controlling circuit.

The pump device of such a constitution can be used for air cooling or water cooling, for example. When the driving circuit applies an alternating voltage to the piezoelectric material of the piezoelectric element sealing one side of the pump chamber, the piezoelectric material vibrates, increasing and decreasing pressure within the pump chamber. When the piezoelectric material operates so as to expand the space of the pump chamber, the pressure within the pump chamber is decreased, and a fluid is taken in from the fluid suction opening. Then, when the piezoelectric material operates so as to contract the space of the pump chamber, a pressure is applied to the fluid within the pump chamber, so that the fluid within the pump is pushed out and swiftly discharged from the discharge opening to the outside. The driving circuit drives the piezoelectric element such that the piezoelectric material performs the operation of expanding the space of the pump chamber and the operation of contracting the space of the pump chamber at a predetermined frequency.

At this time, when input power is changed by the duty ratio controlling circuit as described above, a rate or the like at which the fluid is discharged from the discharge opening is changed. Therefore the rate or the like of the fluid output from the pump device can be changed arbitrarily.

On the other hand, piezoelectric element driving voltage may not necessarily be so high as to require the switch circuit to be operated in each cycle of the resonance frequency. At this time, a stop controlling circuit is desirably newly provided in such a manner as to be included in the driving circuit. That is, the present invention preferably has the stop controlling circuit for periodically stopping the switching operation of the switch circuit for an arbitrary period.

The stop controlling circuit can intermittently stop the switching operation of the switch circuit in cycles of m (an arbitrary natural number) times the driving frequency, for example. Thus, energy replenishment is not performed when the switching operation of the switch circuit is stopped periodically. The stop controlling circuit is preferably configured to control the input power for the piezoelectric element by changing the frequency (cycle) of the stopped operation during which energy replenishment is not performed.

According to the present invention, it is possible to perform efficient driving with a simple constitution and at a desired frequency, and to provide a piezoelectric element driving circuit that can change input power input to a piezoelectric element and reduce power consumption and a pump device using the driving circuit.

BRIEF DESCRIPTION OF THE DRAWINGS

FIGS. 4A to 4C are diagrams of operating waveforms when a driving duty ratio is relatively low;

FIGS. 5A to 5C are diagrams of operating waveforms when the driving duty ratio is relatively high;

FIGS. 7A to 7F are diagrams of operating waveforms of the circuit shown in FIG. 6;

FIG. 9A and FIG. 9B are circuit block diagrams showing configurations of driving circuits according to a second embodiment, FIG. 9A being a diagram illustrating a case where a reactance element is connected and disposed on the secondary side of an electromagnetic coupling transformer 2, and FIG. 9B being a diagram illustrating a case where a reactance element is connected and disposed on the primary side of an electromagnetic coupling transformer 2;

DETAILED DESCRIPTION OF THE PREFERRED EMBODIMENTS

Preferred embodiments of the present invention will hereinafter be described with reference to the drawings.

First Embodiment

The present embodiment relates to an embodiment of a "piezoelectric element driving circuit" according to the present invention.

Figure 1A:
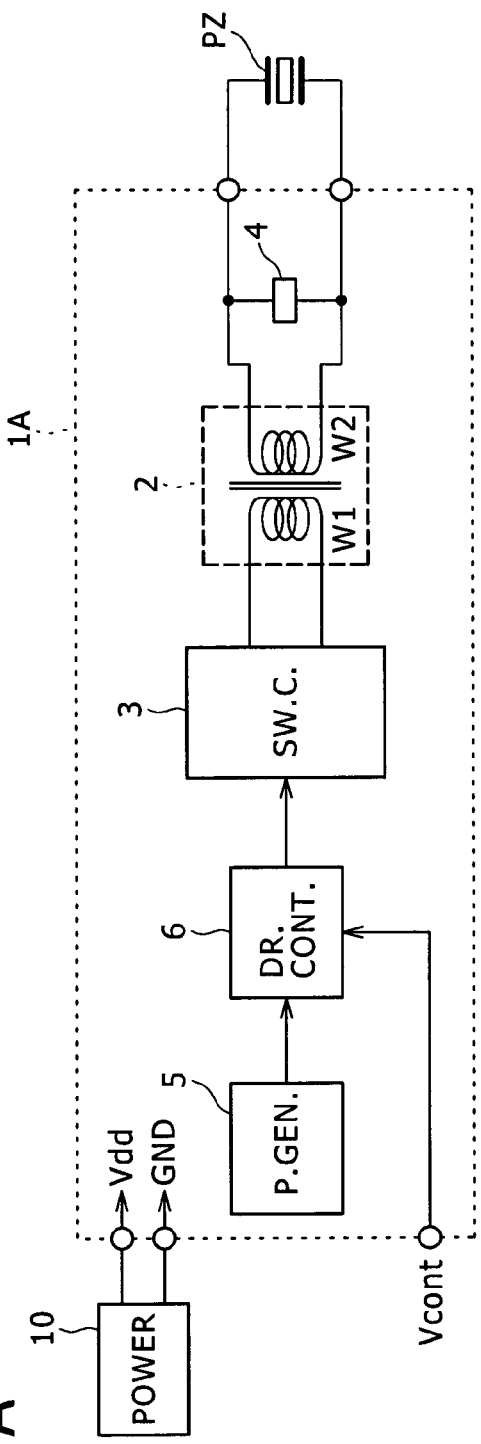
FIG. 1A and FIG. 1B are circuit block diagrams showing configurations of driving circuits according to a first embodiment, FIG. 1A being a diagram illustrating a case where a reactance element is connected and disposed on the secondary side of an electromagnetic coupling transformer 2, and FIG. 1B being a diagram illustrating a case where a reactance element is connected and disposed on the primary side of an electromagnetic coupling transformer 2.
Figure 1B:
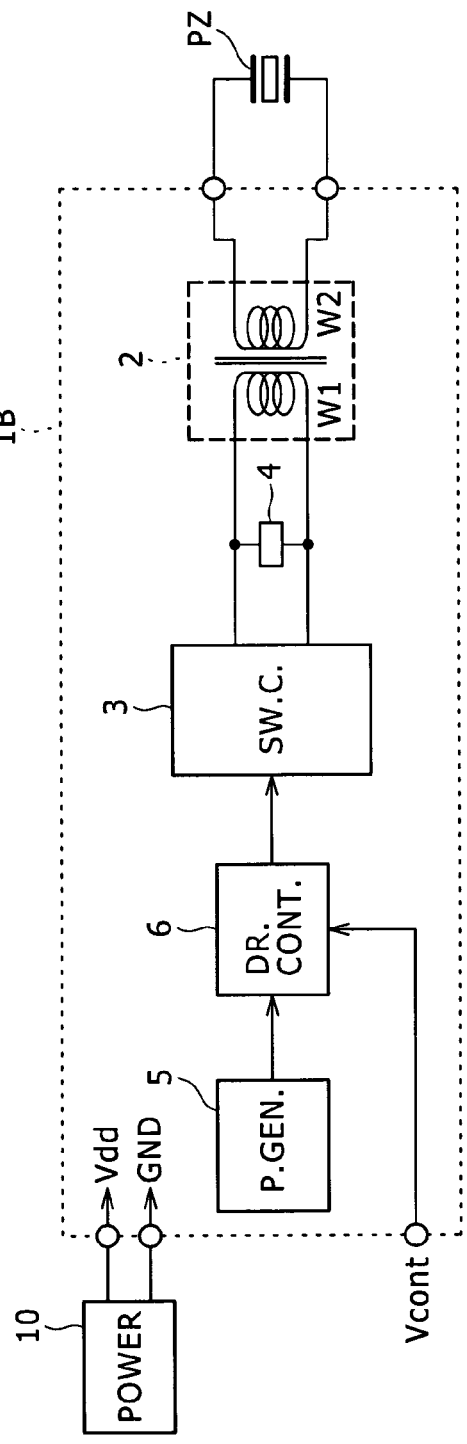

FIG. 1A and FIG. 1B are circuit block diagrams of piezoelectric element driving circuits.

The driving circuits 1A and 1B illustrated in FIG. 1A and FIG. 1B each include an electromagnetic coupling transformer 2, a switch circuit 3, a reactance element 4, a pulse generating circuit 5, and a duty ratio controlling circuit 6.

The driving circuits 1A and 1B shown in FIG. 1A and FIG. 1B each have the electromagnetic coupling transformer 2. The electromagnetic coupling transformer 2 includes a primary side winding circuit, a secondary side winding circuit, and a magnetic material having a relative permeability of one or more between the two winding circuits. The two winding circuits are electromagnetically coupled to each other by the magnetic material.

The electromagnetic coupling transformer 2 has a turns ratio exceeding a ratio of a power supply side voltage value to a specification voltage value on a load side. More specifically, the electromagnetic coupling transformer 2 according to the present embodiment has a turns ratio such that the rate of the number of turns of a secondary winding W2 on the load side is high with respect to the rate of the number of turns of a primary winding W1 on a power supply side as compared with a normal ratio of the number of turns of the primary winding W1 to the number of turns of the secondary winding W2, the normal ratio being defined by the above-described ratio of the power supply side voltage value to the specification voltage value on the load side.

FIG. 1A is a diagram showing the reactance element 4 being connected in parallel with the secondary side winding circuit of the electromagnetic coupling transformer 2. FIG. 1B is a diagram showing the reactance element 4 being connected in parallel with the primary side winding circuit of the electromagnetic coupling transformer 2. Whether the winding circuit side to which the reactance element 4 is connected is the primary side or the secondary side of the electromagnetic coupling transformer 2 may be determined according to the withstand voltage specification or the reactance value of the reactance element 4.

In each of the driving circuits 1A and 1B, the switch circuit 3 is connected to the primary winding W1 of the electromagnetic coupling transformer 2, and a piezoelectric element PZ is connected to the secondary winding W2 of the electromagnetic coupling transformer 2.

The pulse generating circuit 5 is connected to the duty ratio controlling circuit 6, and the duty ratio controlling circuit 6 is connected to the switch circuit 3 so that a pulse signal generated by the pulse generating circuit 5 can be input to the switch circuit 3 after the duty ratio of the pulse signal is controlled by the duty ratio controlling circuit 6.

A power supply voltage Vdd for driving the driving circuits 1A and 1B and a reference voltage (for example a ground voltage GND) are supplied from an external power supply circuit (POWER) 10. A voltage controlling signal Vcont for the duty ratio controlling circuit 6 is also supplied externally.

Description will next be made of the general operation of the driving circuits 1A and 1B and a configuration for changing resonance frequency. In this case, the operations of the driving circuits 1A and 1B are basically the same.

The switch circuit 3 controlled by the pulse signal operates so as to repeatedly set the primary winding W1 to an on state in which a current is passed through the primary winding W1 and an off state in which the current is not passed through the primary winding W1 at a predetermined frequency specified by the input pulse signal. At this time, for example, the on state corresponds to the high level of the pulse, and the off state corresponds to the low level of the pulse.

The frequency (period T) of primary side current driving of the electromagnetic coupling transformer 2 is defined as current driving frequency. The current driving frequency is desirably set to coincide with the resonance frequency of a resonant circuit formed by the secondary side winding circuit. While operation is possible even when the current driving frequency does not perfectly coincide with the resonance frequency, it is desirable that the current driving frequency coincide with the resonance frequency in order to make the waveform of voltage applied to the piezoelectric element a sinusoidal wave and perform efficient driving, as will be described later.

One of features of the driving circuits 1A and 1B is the intermittent primary side driving of the electromagnetic coupling transformer 2 which driving is performed by repeating the on state and the off state described above. In other words, the current driving is performed by sending current intermittently with a current stop state in between. Due to such current driving, power consumed by the switch circuit 3 on the primary side is relatively low because the power consumed by the switch circuit 3 is a time average of power consumed by pulse current of short duration.

Another feature is that the on time of the driving pulse can be shortened by setting the turns ratio of the electromagnetic coupling transformer 2 higher than the normal ratio. Details of this point will be described later.

Once the pulse current is applied to the primary side of the electromagnetic coupling transformer 2, an alternating voltage is applied to the piezoelectric element PZ due to a resonance phenomenon of the resonant circuit on the secondary side. When the electromagnetic coupling transformer 2 is thereafter left as it is in the off state, the alternating voltage gradually attenuates. This attenuation is caused by a loss of energy due to a copper loss of the resonant circuit (winding circuit) or the like. In the present embodiment, preferably, energy replenishment by a next pulse current from the primary side is performed for a short time before the positive peak value and the negative peak value of the alternating voltage supplied to the piezoelectric element PZ on the secondary side of the electromagnetic coupling transformer 2 each attenuate, and this is repeated cyclically. However, energy replenishment may be performed cyclically for a short time after the alternating voltage supplied to the piezoelectric element PZ attenuates to a certain degree.

In the present embodiment, there is no electric discharge path from the resonant circuit to the outside (for example, the GND line), and electric discharge to the outside is not substantially performed. As already described, a loss of energy due to a copper loss of the resonant circuit (winding circuit) or the like is compensated for by intermittent current driving from the primary side. All of the energy loss is compensated for from the primary side to an absolute minimum degree.

Thus, very efficient operation is possible, and low power consumption is achieved.

The magnitude of an equivalent capacitance value of the piezoelectric element PZ is determined according to a use of the piezoelectric element PZ. It can be difficult to make the current driving frequency coincide with or substantially equal the resonance frequency of the resonant circuit by merely changing the frequency (current driving frequency) of the pulse signal generated by the pulse generating circuit 5.

Therefore, in this case, the reactance element 4 is added to the resonant circuit to make the current driving frequency coincide with or substantially equal the resonance frequency of each resonant circuit. The reactance element 4 forms the resonant circuit that performs parallel resonance at the (current) driving frequency with a capacitance component in an equivalent circuit of the piezoelectric element PZ and an inductance component of the electromagnetic coupling transformer 2.

The reactance element 4 can be added to the resonant circuit by connecting a capacitor in parallel with the piezoelectric element PZ or connecting an inductor in parallel with or in series with the piezoelectric element PZ.

Figure 2:
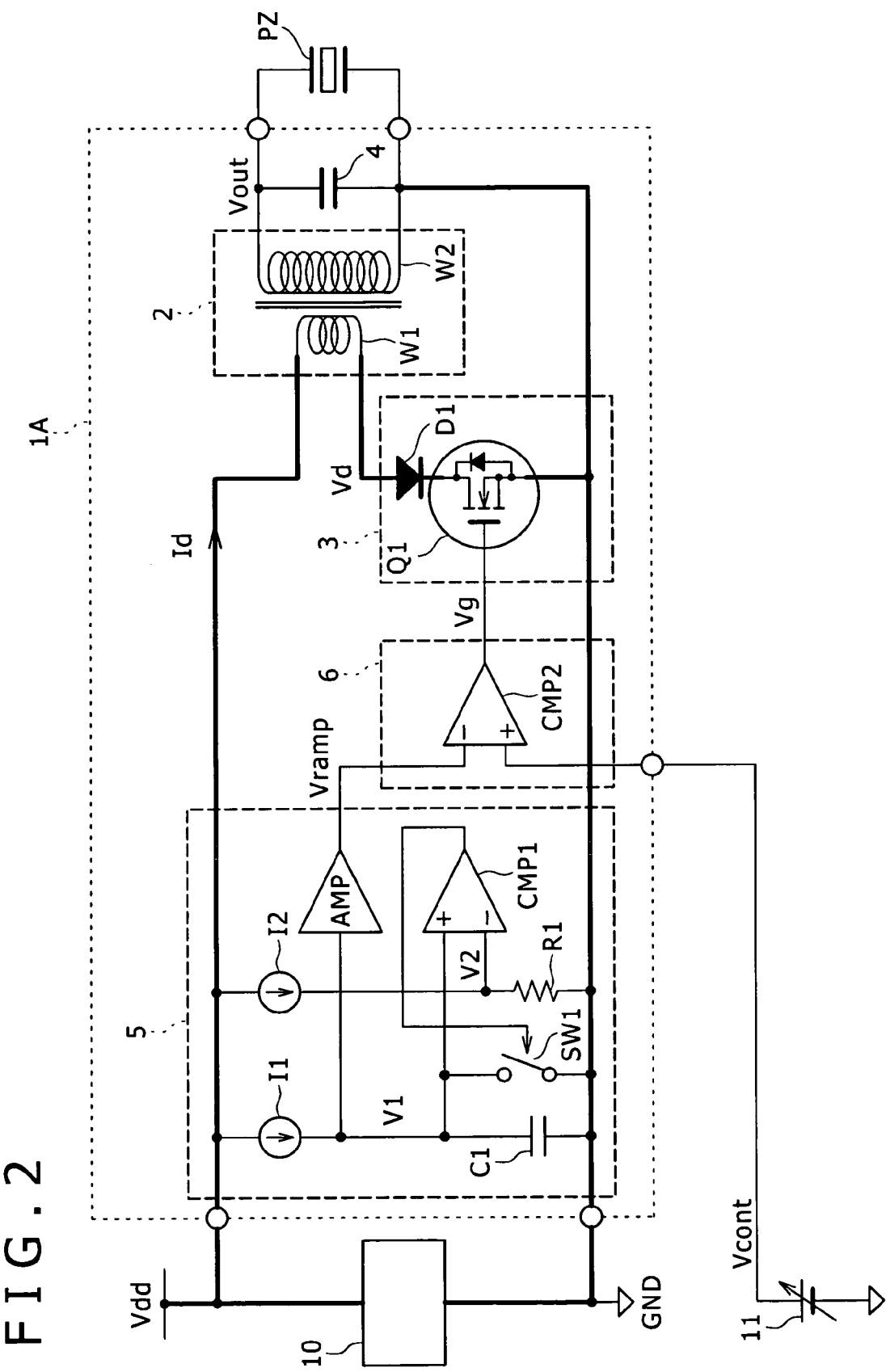
FIG. 2 is a concrete circuit diagram of a unipolar type driving circuit according to the first embodiment.

FIG. 2 is a more detailed diagram than FIG. 1A, showing a concrete example of the circuit according to the present embodiment. FIGS. 3A to 3G are diagrams of operating waveforms of the circuit shown in FIG. 2.

The pulse generating circuit 5 shown in FIG. 2 includes two current sources 11 and 12, an amplifier AMP, a comparator CMP1, a switch SW1, a capacitor C1, and a resistance R1.

The current source I1 and the capacitor C1 are connected in series with each other between a terminal for supplying the power supply voltage Vdd of the power supply circuit 10 and a terminal for supplying the ground voltage GND of the power supply circuit 10. Similarly, the current source I2 and the resistance R1 are connected in series with each other between the terminal for supplying the power supply voltage Vdd and the terminal for supplying the ground voltage GND.

The non-inverting input "+" of the comparator CMP1 is connected to a point of connection between the current source I1 and the capacitor C1, so that a voltage V1 at the point of connection can be input to the non-inverting input of the comparator CMP1. The inverting input "−" of the comparator CMP1 is connected to a point of connection between the current source I2 and the resistance R1, so that a voltage V2 at the point of connection can be input to the inverting input of the comparator CMP1.

The switch SW1 is connected between the non-inverting input "+" of the comparator CMP1 and the terminal for supplying the ground voltage GND so as to be able to discharge a voltage retained by the capacitor C1. The switch SW1 is controlled according to the output of the comparator CMP1.

The voltage V1 can be output from the pulse generating circuit 5 after being amplified by the amplifier AMP. The amplifier AMP has a high input impedance and a low output impedance. The amplifier AMP serves a function of impedance conversion as an amplifier referred to generally as a buffer amplifier.

The duty ratio controlling circuit 6 is formed by one comparator CMP2. The comparator CMP2 has an inverting input "−" connected to the output of the amplifier AMP, and has a non-inverting input "+" connected to the terminal for supplying the voltage controlling signal Vcont. The voltage controlling signal Vcont is generated by an external variable voltage source 11, and then supplied to the duty ratio controlling circuit 6.

The switch circuit 3 includes one diode D1 and an NMOS transistor Q1.

The primary winding W1 of the electromagnetic coupling transformer 2 is connected between the terminal for supplying the power supply voltage Vdd and the anode of the diode D1. The NMOS transistor Q1 is connected between the cathode of the diode D1 and the terminal for supplying the ground voltage GND. The gate of the NMOS transistor Q1 is connected to the output of the comparator CMP2.

The diode D1 is a reverse current preventing diode for preventing a flow of driving current caused by the body diode of the NMOS transistor Q1 when the gate voltage (signal Vg) of the NMOS transistor Q1 is at a low level. The diode D1 can be omitted when the effect of the body diode is negligible.

The operation of the thus formed driving circuit 1A will next be described, referring to FIGS. 3A to 3G as appropriate.

Figure 3A:
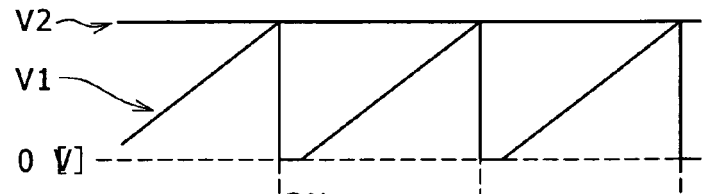
FIGS. 3A to 3G are diagrams of operating waveforms of the circuit shown in FIG. 2.
Figure 3B:

FIG. 3A shows the waveforms of the voltages V1 and V2, which are voltages input to the comparator CMP1 in FIG. 2. FIG. 3B shows the waveform of gate voltage of the switch SW1.

Because a current flowing through the resistance R1 in FIG. 2 is generated by the current source I2, a fixed stable potential difference (the voltage V2) occurs in the resistance R1, as shown in FIG. 3A. A potential difference (the voltage V1) occurs across the capacitor C1 which potential difference increases in proportion to an elapsed time during which a current is applied across the capacitor C1. The voltage V1 increases monotonically while the capacitor C1 is charged.

The comparator CMP1 compares the voltage V2 across the resistance R1 with the voltage (voltage V1) retained by the capacitor C1. When the voltage (voltage V1) retained by the capacitor C1 exceeds the voltage V2 across the resistance R1, the comparator CMP1 turns on the switch SW1, which is normally in an opened state (FIG. 3B). Then, a charge stored in the capacitor C1 is discharged via the switch SW1. The voltage (voltage V1) retained by the capacitor C1 therefore becomes zero (FIG. 3A).

When the voltage (voltage V1) retained by the capacitor C1 becomes zero, the comparator CMP1 turns off the switch SW1, so that the voltage (voltage V1) retained by the capacitor C1 monotonically increases again.

Figure 3C:
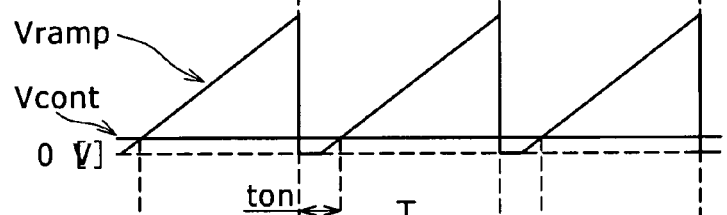
Figure 3D:
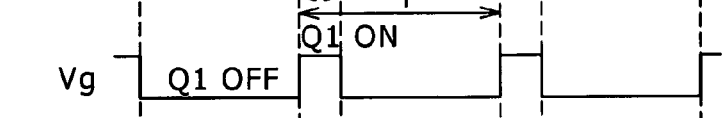

FIG. 3C shows the waveforms of voltages input to the comparator CMP2. FIG. 3D shows the waveform of the output voltage of the comparator CMP2, that is, the signal Vg applied to the gate of the NMOS transistor Q1.

As a result of repeating the above-described operation, a sawtooth-shaped pulse wave Vramp is output from the pulse generating circuit 5 in FIG. 2, as shown in FIG. 3C. The oscillation frequency of the pulse wave Vramp is made to coincide substantially with the resonance frequency on the secondary side of the electromagnetic coupling transformer 2 by setting each of the value of the capacitor C1, the respective current values of the current sources 11 and 12, and the value of the resistance R1 to an appropriate value.

The voltage controlling signal Vcont supplied from the outside of the driving circuit 1A is an arbitrary DC signal, and is a signal intended to control a driving signal Vout (FIG. 2 and FIG. 3G) supplied to the piezoelectric element PZ.

The comparator CMP2 as the duty ratio controlling circuit 6 compares the voltage values of the pulse wave Vramp and the voltage controlling signal Vcont with each other (FIG. 3C). The comparator CMP2 outputs the signal Vg for controlling the on state and the off state of the switch circuit 3 according to a result of the comparison, as shown in FIG. 3D.

In this case, when the signal Vg is at a high level, the switch circuit 3 assumes the on state in which the switch circuit 3 passes an output current. On the other hand, when the signal Vg is at a low level, the switch circuit 3 assumes the off state in which the switch circuit 3 does not pass an output current.

The primary side current Id of the electromagnetic coupling transformer 2 is also the output current of the switch circuit 3.

Figure 3E:
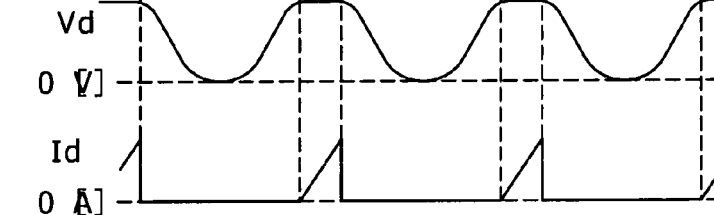
Figure 3F:
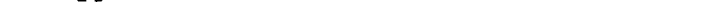

When the switch circuit 3 is in the on state for a short time, the primary side current Id rises linearly as shown in FIG. 3F after the switch (NMOS transistor Q1) is set in the on state, due to a leakage inductance on the primary side of the electromagnetic coupling transformer 2.

Figure 3G:
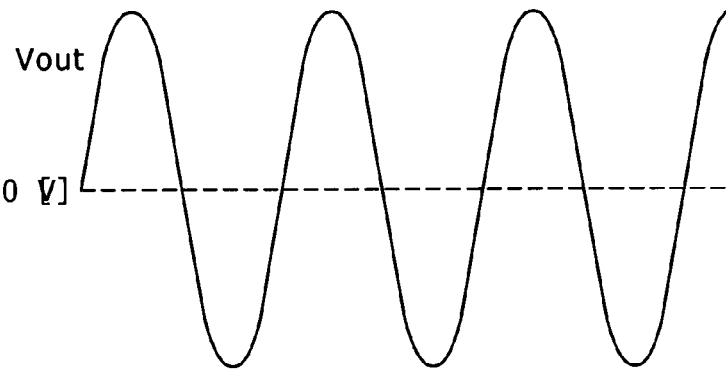

As shown in FIG. 3E, a pseudo-sinusoidal wave whose peak value is limited according to the primary side current Id appears on the primary side of the electromagnetic coupling transformer 2. Then, as shown in FIG. 3G, a sinusoidal wave of a magnitude corresponding to the turns ratio of the electromagnetic coupling transformer 2 appears as driving signal Vout in the secondary winding W2 of the electromagnetic coupling transformer 2.

In the above operation, letting T be a period of the signal Vg, and ton be a pulse duration, a time during which the switch circuit 3 is in the on state is changed depending on the duty ratio (ton/T), and the peak value of the primary side current Id is also changed depending on the duty ratio. The duty ratio of the signal Vg can be controlled by the magnitude of the voltage controlling signal Vcont.

FIGS. 4A to 4C and FIGS. 5A to 5C show states in which the primary side current Id and the secondary side voltage, that is, the driving signal Vout for the piezoelectric element PZ are changed depending on the duty ratio of the signal Vg. FIG. 4A and FIG. 5A each show the waveform of the signal Vg. FIG. 4B and FIG. 5B each show the waveform of the primary side current Id. FIG. 4C and FIG. 5C each show the waveform of the driving signal Vout.

The signal Vg of FIG. 4A has a lower duty ratio than the signal Vg of FIG. 5A. This is because the voltage controlling signal Vcont is controlled to be relatively small in FIG. 3C. The low duty ratio of the signal Vg makes the peak value of the primary side current Id in FIG. 4B also relatively low. As a result, the amplitude of the driving signal Vout is also low depending on the peak value of the primary side current Id.

On the other hand, when the voltage controlling signal Vcont is set relatively large in FIG. 3C, the duty ratio of the signal Vg in FIG. 5A becomes high. The peak value of the primary side current Id in FIG. 5B can therefore be increased. As a result, the amplitude of the driving signal Vout in FIG. 5C can be controlled to be large.

Thus, the present embodiment enables the driving amplitude for the piezoelectric element PZ to be controlled to an appropriate value by changing the duty ratio of the pulse signal driving the switch circuit 3.

Description will next be made of the resonance frequency in the above operation.

The resonance frequency fdrv when the piezoelectric element PZ is driven is set in the resonant circuit in a state in which the transistor (NMOS transistor Q1) within the switch circuit 3 is off. This is to reduce power consumption of the driving circuit.

The resonance frequency fdrv is expressed by the following Equation (1-1) or Equation (1-2) with the reactance component Xext connected in parallel with the capacitance component Cpz of the piezoelectric element, the secondary side leakage inductance component L2 of the electromagnetic coupling transformer 2, and the mutual inductance M of the electromagnetic coupling transformer 2. Equation (1-1) expresses the resonance frequency fdrv when the reactance component Xext is a capacitive component. Equation (1-2) expresses the resonance frequency fdrv when the reactance component Xext is an inductive component.

$$fdrv=1/(2\pi((L2+M)\times(Cpz+Xext))1/2) \quad (1\text{-}1)$$

$$fdrv=1/(2\pi((L2+M)Xext/(L2+M+Xext)\times Cpz)1/2) \quad (1\text{-}2)$$

The NMOS transistor Q1 in the on state is in a state of low impedance. Therefore, the primary side of the electromagnetic coupling transformer 2 is in a short-circuited state, as it were. In a common T-type equivalent circuit of the electromagnetic coupling transformer 2, the primary side leakage inductance L1 of the primary side winding circuit and the mutual inductance M of the electromagnetic coupling transformer 2 are connected in parallel with each other.

The resonance frequency at this time can be formulated by substituting on-time mutual inductance M(on) expressed as M(on)=L1×M/(L1+M) for "M" in Equation (1-1) or Equation (1-2) described above.

In general, the primary side leakage inductance L1 is a value of a few percent of the mutual inductance M, and thus the on-time mutual inductance M(on) is also a value of a few percent of the (off-time) mutual inductance M. Hence, the resonance frequency when the NMOS transistor Q1 is in the on state is increased by about an order of magnitude as compared with the resonance frequency fdrv at the time of driving the piezoelectric element.

Thus, when the NMOS transistor Q1 is set in the on state, the switch circuit 3 shows response faster than at the resonance frequency fdrv set with the NMOS transistor Q1 in the off state, and driving current rises quickly.

When the on state of the NMOS transistor Q1 continues for a long time, the driving current passes a peak, starts to decrease, and exhibits vibratory behavior.

In order to control the amplitude of the voltage in the secondary side resonant circuit of the electromagnetic coupling transformer 2, the on period of the NMOS transistor Q1 may be from a time when the NMOS transistor Q1 is set in the on state and the driving current (primary side current Id) starts to flow to a time when the driving current reaches a peak value after the slope of increase in primary side current Id gradually decreases. This is because when the driving current reaches the peak value, the amplitude of the voltage in the secondary side resonant circuit of the electromagnetic coupling transformer 2 also reaches a peak value.

Retaining the output transistor in the on state even when the driving current has passed the peak value is meaningless in terms of controlling the resonance voltage on the secondary side of the electromagnetic coupling transformer 2, and causes unnecessary consumption of driving power.

The duty ratio controlling circuit 6 is supplied with a driving pulse from the pulse generating circuit 5. The duty ratio controlling circuit 6 limits the duty ratio of the driving pulse according to the input voltage controlling signal Vcont such that the value of the driving voltage generated in the secondary winding W2 of the electromagnetic coupling transformer 2 falls within a range equal to or lower than a specification voltage value on the load side. The "specification voltage value on the load side" refers to for example a maximum rated voltage of the piezoelectric element PZ or a recommended application voltage. The duty ratio controlling circuit 6 outputs the driving pulse whose duty ratio is limited to the switch circuit 3.

The driving voltage for the piezoelectric element PZ is intrinsically increased according to the turns ratio of the electromagnetic coupling transformer 2. In the present embodiment, the turns ratio is set such that the rate of the number of turns of the secondary winding W2 is higher, exceeding the ratio between the power supply side voltage value and the specification voltage value on the load side. Hence, even when the duty ratio controlling circuit 6 lowers the duty ratio of the driving pulse, the amplitude of the driving voltage necessary for the piezoelectric element PZ can be maintained. On the other hand, the power consumed by the switch circuit 3 is a time average of power consumed during times that the driving pulse is on. Therefore, when the duty ratio of the driving pulse becomes relatively low, the power consumed by the switch circuit 3 is correspondingly reduced.

The time of the on state of the NMOS transistor Q1 is thus limited by controlling the duty ratio of the driving pulse by the duty ratio controlling circuit 6, whereby input power for the piezoelectric element PZ can be controlled such that lower power consumption is achieved.

Figure 6:
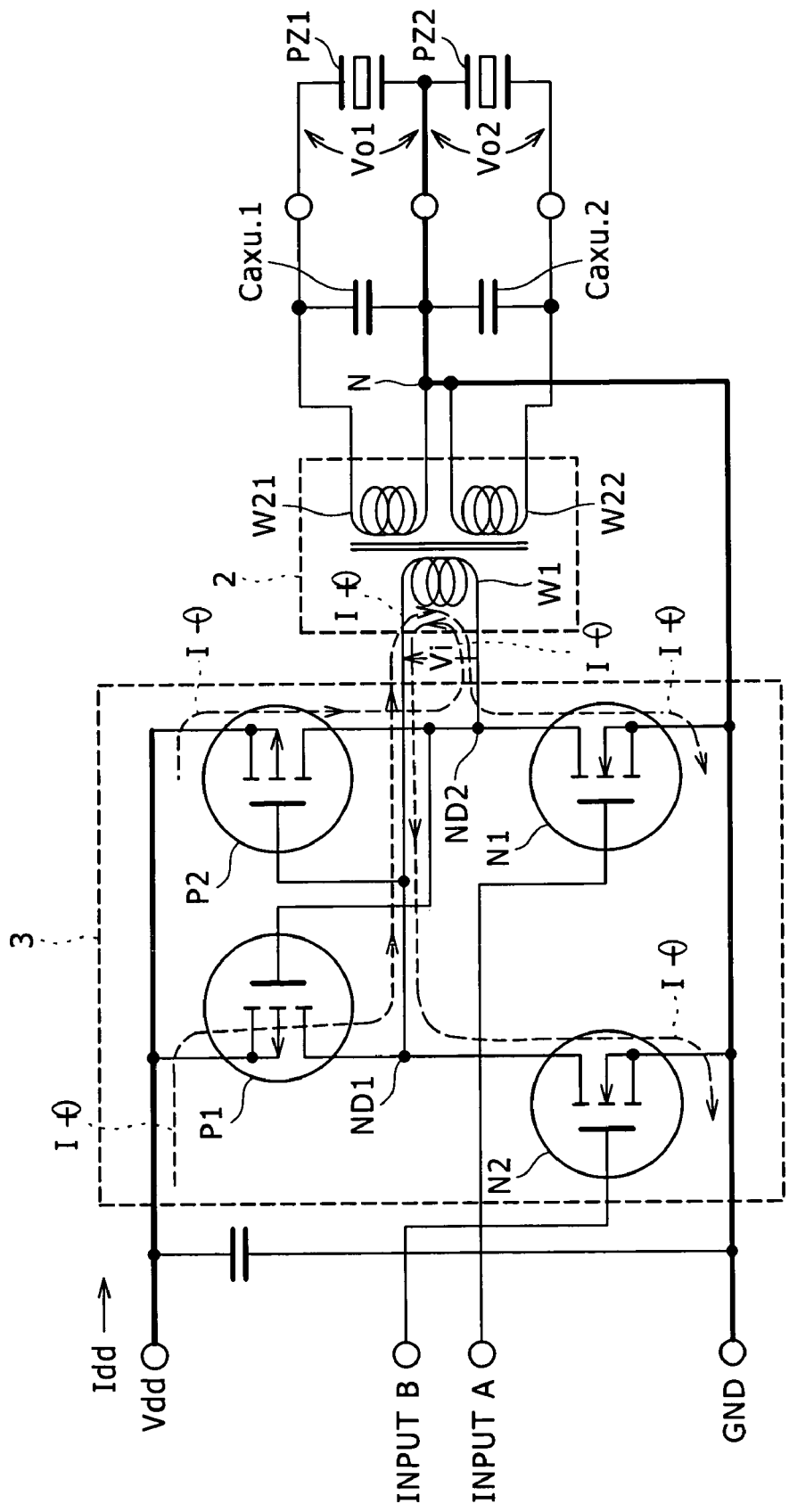
FIG. 6 is a concrete circuit diagram of a bipolar type driving circuit according to the first embodiment.

FIG. 6 is another concrete circuit diagram relating to the first embodiment. FIGS. 7A to 7F are diagrams of operating waveforms of a circuit of FIG. 6.

The configuration of a switch circuit 3 of the circuit illustrated in FIG. 6 is different from that of the circuit illustrated in FIG. 2 described above. Though not shown in FIG. 6, as in the circuit of FIG. 2 described above, a pulse generating circuit 5 is connected to the switch circuit 3 via a duty ratio controlling circuit 6, and the duty ratio controlling circuit 6 controls the duty ratio of a driving pulse for the switch circuit 3.

In addition, an input A and an input B are used in FIG. 6 in place of the signal Vg in FIG. 2. The input A and the input B are, for example, signals shifted in phase from each other by a half cycle and differentially operating transistors connected to the respective inputs. The duty ratio controlling circuit 6 not shown in the figure controls the duty ratio of each of the input A and the input B according to a voltage controlling signal Vcont input to the duty ratio controlling circuit 6.

The primary side of the electromagnetic coupling transformer 2 in the circuit of FIG. 2 already described has two states, that is, the on state in which the primary side current Id flows through the primary winding W1 in one direction and the off state in which the primary side current Id does not flow through the primary winding W1. Such driving is generally referred to as unipolar driving.

On the other hand, the primary side of a electromagnetic coupling transformer 2 in the circuit of FIG. 6 has three states, that is, an on state in which a primary side current Id flows through a primary winding W1 in one direction (positive direction), an on state in which the primary side current Id flows through the primary winding W1 in an opposite direction (negative direction), and an off state in which the primary side current Id does not flow through the primary winding W1. Such driving is generally referred to as bipolar driving.

FIG. 6 illustrates a driving circuit that drives two piezoelectric elements PZ1 and PZ2. The secondary winding W2 of the electromagnetic coupling transformer 2 includes two second winding coils W21 and W22.

The piezoelectric element PZ1 forms a resonant circuit together with an auxiliary capacitor Caxu.1 and the second winding coil W21. Similarly, the piezoelectric element PZ2 forms another resonant circuit together with an auxiliary capacitor Caxu.2 and the second winding coil W22. The values of the auxiliary capacitors Caxu.1 and Caxu.2 of the two resonant circuits are each determined such that the two resonant circuits have a same resonance frequency. At this time, the resonance frequency of the resonant circuit is determined by a combined capacitance of an equivalent capacitance component of the piezoelectric element PZ1 and the auxiliary capacitor Caxu.1 and an inductance of the second winding coil W21, and the resonance frequency of the other resonant circuit is determined by a combined capacitance of an equivalent capacitance component of the piezoelectric element PZ2 and the auxiliary capacitor Caxu.2 and an inductance of the second winding coil W22.

In the present example, one electrode of the piezoelectric element PZ1 and one electrode of the piezoelectric element PZ2 are connected to each other on the side of a midpoint node N. The auxiliary capacitor Caxu.1 is connected between the midpoint node N and another electrode of the piezoelectric element PZ1. Similarly, the auxiliary capacitor Caxu.2 is connected between the midpoint node N and another electrode of the piezoelectric element PZ2.

This midpoint node N is connected to a ground voltage GND. This is to eliminate an effect of static electricity. Incidentally, the connection of the midpoint node N to the ground voltage GND does not affect operation because a path through the midpoint node N to the ground voltage GND does not form a discharge path at a time of high-frequency driving.

The switch circuit 3 connected to the primary winding W1 of the electromagnetic coupling transformer 2 is an H-bridge circuit of a four-transistor configuration as shown in FIG. 6.

The switch circuit 3 has two PMOS transistors P1 and P2 and two NMOS transistors N1 and N2. The primary winding W1 is connected between nodes ND1 and ND2 within the switch circuit 3.

The source of the transistor P1 is connected to a terminal for supplying a power supply voltage Vdd. The drain of the transistor P1 is connected to the node ND1. The gate of the transistor P1 is connected to the node ND2.

The source of the transistor P2 is connected to the terminal for supplying the power supply voltage Vdd. The drain of the transistor P2 is connected to the node ND2. The gate of the transistor P2 is connected to the node ND1.

The drain of the transistor N1 is connected to the node ND2. The source of the transistor N1 is connected to a terminal for supplying the ground voltage GND. The gate of the transistor N1 is connected to a terminal for supplying the input A.

The drain of the transistor N2 is connected to the node ND1. The source of the transistor N2 is connected to the terminal for supplying the ground voltage GND. The gate of the transistor N2 is connected to a terminal for supplying the input B.

In the thus formed switch circuit 3, when the input A is set to a high level ("H") with the input B at a low level ("L"), the transistors N1 and P1 are turned on, so that a positive current I(+) flows through the transistor P1 in the on state, the node ND1, the primary winding W1, the node ND2, and the transistor N1 in the on state to the ground voltage GND (see FIG. 6).

When the input B is set to "H" with the input A in a state of "L", the transistors N2 and P2 are turned on, so that a negative current I(−) flows through the transistor P2 in the on state, the node ND2, the primary winding W1, the node ND1, and the transistor N2 in the on state to the ground voltage GND (see FIG. 6).

As shown in FIG. 7A, the period of "H" of the input A is defined by a pulse of a duration (indicated by ON(+)) shorter than a fixed half cycle T/2. This pulse is repeated in fixed cycles T.

As shown in FIG. 7B, the period of "H" of the input B is defined by a short duration (indicated by ON(−)) different in phase from the pulse of the input A by 180 degrees and having the same cycle T. The durations (so-called pulse widths) of the two pulses may be different from each other. In this case, however, suppose that the durations of the two pulses are the same.

Hereinafter, the duration of the pulse of the input A will be referred to as a "positive current driving time" or an "ON(+) time". The duration of the pulse of the input B will be referred to as a "negative current driving time" or an "ON(−) time".

A fixed off state period during which no current flows through the primary winding W1 exists between an ON(+) time and a next ON(−) time and between the ON(−) time and a next ON(+) time.

During the off state period, the four transistors N1, N2, P1, and P2 forming the switch circuit 3 shown in FIG. 6 are all off, and thus the switch circuit 3 is in a state of high impedance as viewed from both ends of the primary winding W1. Hence, during the off state period, a current at a level of an off leak of the transistors flows, and therefore power consumption is practically equal to zero.

In FIG. 7C, the magnitude (absolute value) of the positive current I(+) and the negative current I(−) is represented by "|I|".

The pulse being turned on, the current starts to flow and then becomes saturated. In the present example, the ON(+) time and the ON(−) time are determined such that the pulse is turned off at the time of the saturation. In other words, the duty ratio is set such that the pulse is turned off at the time of the saturation of the current. Thus, the positive current I(+) and the negative current I(−) are generally made to flow until the positive current I(+) and the negative current I(−) become saturated, at least, excluding a case where an unsaturated region is used intentionally. After the saturation, however, further lengthening pulse width is not very meaningful in terms of operation, and increases power consumption. Hence, it is desirable to set the ON(+) time and the ON(−) time in the vicinity of the time of the current saturation at a maximum.

On the other hand, the duty ratio controlling circuit 6 not shown in the figure can make the duty ratios of the input A and the input B lower than the duty ratio determined by the time of the saturated current.

A voltage across the primary winding W1 will be defined as the voltage (primary side voltage V1) of the node ND1 with respect to the node ND2 in FIG. 6. The waveform of the voltage is shown in FIG. 7D.

Supposing that the on resistance of the transistors is negligible, the primary side voltage V1(+) during the ON(+) time and the primary side voltage V1(−) during the ON(−) time both have substantially the magnitude of the power supply voltage Vdd (about 5 V, for example). The voltages during the intermittent short times are set in the primary winding W1 forcefully by operation on the primary side. On the other hand, in periods between the intermittent short times, primary side voltage force on the primary winding W1 is removed, and a voltage dependent on the resonance frequency of the resonant circuit also appears on the primary side due to an effect of the secondary side.

In this operation, when current driving frequency (frequency of operation of repeating the setting of the primary side voltages Vi(+) and Vi(−)) substantially coincides with the resonance frequency of the resonant circuit as described above, the primary side voltage V1 has a substantially sinusoidal waveform as shown in FIG. 7D. The driving of the piezoelectric elements is therefore smooth, efficient, and desirable.

When the frequencies do not perfectly coincide with each other, a discontinuity occurs in the waveform of the primary side voltage V1 at the times of intermittent setting of the primary side voltage. However, because operating frequency itself is determined by the current driving frequency on the primary side, the driving itself of the piezoelectric elements at a fixed frequency is possible. In this case, however, the driving is not smooth and is decreased in efficiency.

In the present example, the polarity of the second winding coils W21 and W22 is determined such that the piezoelectric elements PZ1 and PZ2 shown in FIG. 6 are driven in opposite phase to each other. The polarity of the second winding coils W21 and W22 is determined by a difference in winding direction and a difference in connection regarding which of a winding start and a winding end is connected to the midpoint node N.

In addition, the turns ratio between the primary side and the secondary side of the electromagnetic coupling transformer 2 determines a voltage boosting ratio. In the present example, the turns ratio of the electromagnetic coupling transformer 2 is primary (W1):secondary (W21):secondary (W22)=1:6:6. Thus, as shown in FIG. 7E and FIG. 7F, driving voltages Vo1 and Vo2 in opposite phase to each other and boosted sixfold are obtained.

The piezoelectric element PZ1 operates on the driving voltage Vo1. The piezoelectric element PZ2 operates on the driving voltage Vo2 in opposite phase to the piezoelectric element PZ1 in terms of mechanical displacement.

Figure 8A:
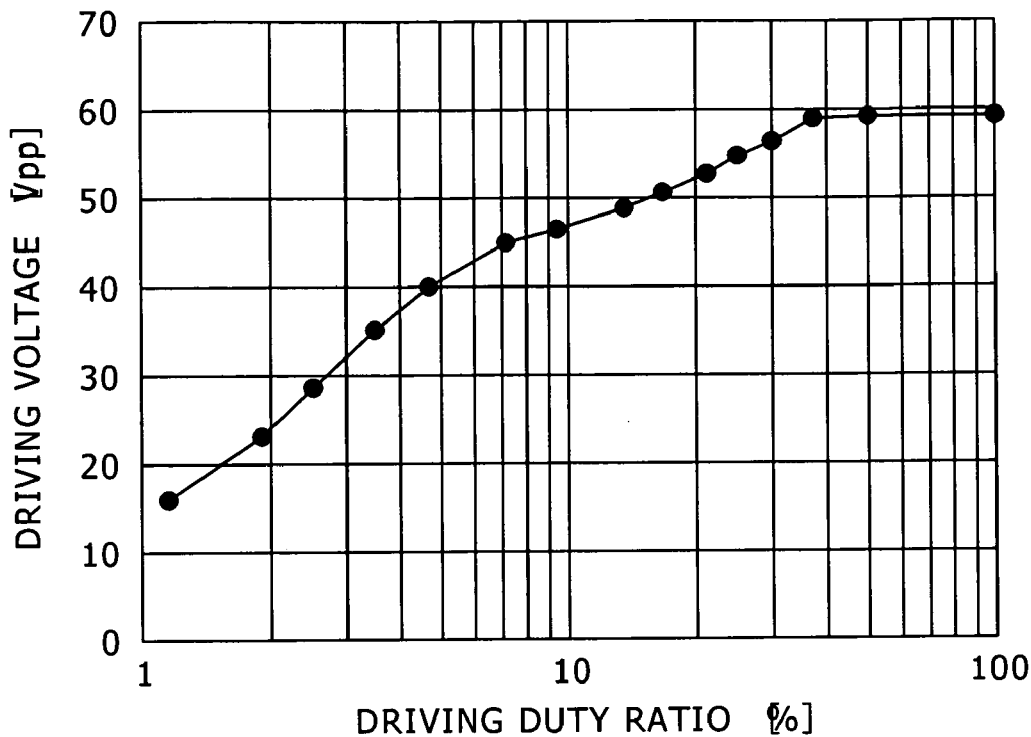
FIG. 8A is a graph showing changes in driving voltage value when the driving duty ratio is varied by changing a voltage controlling signal.
Figure 8B:
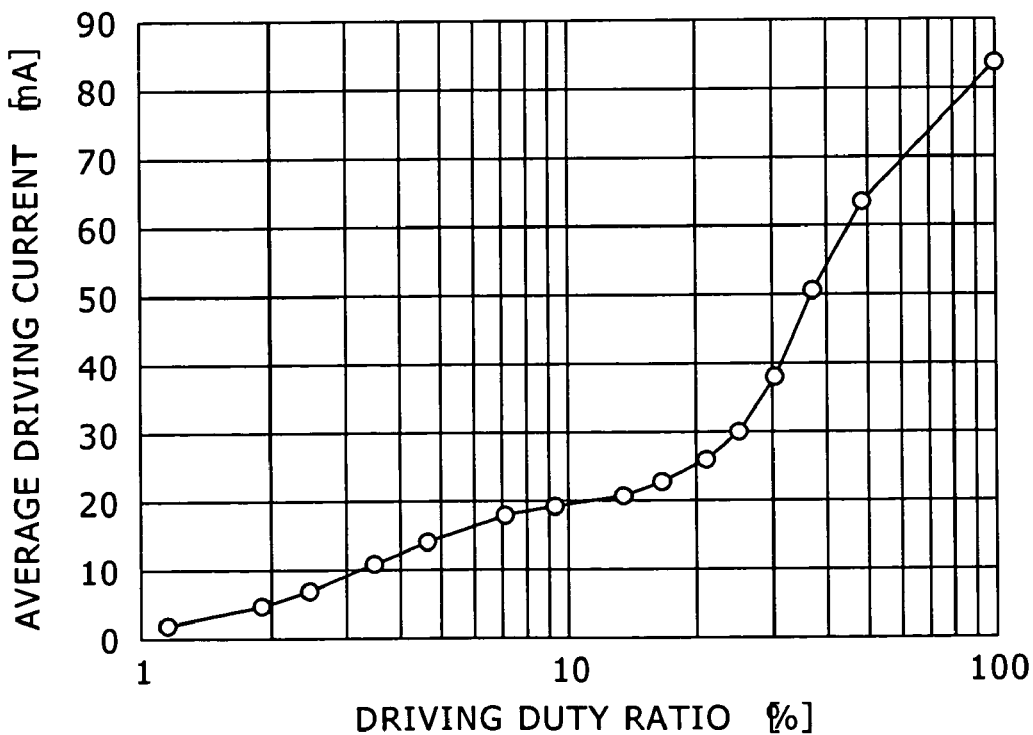
FIG. 8B is a graph showing changes in average driving current when the driving duty ratio is varied similarly.

FIG. 8A and FIG. 8B show driving voltage values and average driving current when the duty ratio (driving duty ratio) of the driving pulse output from the duty ratio controlling circuit 6 is varied by changing the voltage controlling signal Vcont. In this case, the turns ratio of the number of turns of the primary side to the number of turns of the secondary side of the electromagnetic coupling transformer 2 is 1:6. The power supply voltage Vdd is 5.0 V.

While the duty ratio at a time of full driving is defined as 50% in Patent Document 2, the duty ratio at a time of full driving is defined as 100% in FIG. 7.

FIG. 8A shows driving voltage values when the duty ratio is changed from 1% to 100%. FIG. 8A shows that the driving voltage can be controlled in a range where the driving duty ratio is 40% or lower.

FIG. 8B shows average driving current when the duty ratio is changed from 1% to 100%. FIG. 8B shows that the average driving current increases sharply approximately where the driving duty ratio exceeds 20%.

FIG. 8A and FIG. 8B show that efficient power-saving operation can be performed when the piezoelectric element PZ is driven in a range where the driving duty ratio is 20% or lower.

A piezoelectric pump used in an experiment exhibits a sufficient fluid transfer capability at a driving voltage of 30 Vp-p. Thus, from FIG. 8A, the driving duty ratio is 2.5%. FIG. 8B shows that an average driving current at this time is 7 mA. In the present example, 30 Vp-p corresponds to an example of the "specification voltage value on the load side".

Because the power supply voltage Vdd is 5.0 V, consumed power is a minuscule value of 35 mW.

When the electromagnetic coupling transformer 2 is used, an ordinary idea is to make a ratio of the value of the primary side voltage supplied as power to the value of the secondary side voltage as driving voltage supplied to a load equal to a ratio of the number of turns on the primary side to the number of turns on the secondary side.

In the present invention, the power supply voltage Vdd is 5.0 V, and the driving voltage for the piezoelectric elements as a load side is 30 Vp-p, that is, 15 V0-p (volts zero to peak). Hence, the turns ratio of the electromagnetic coupling transformer 2 is 1:3 according to the ordinary idea, whereas the turns ratio of the electromagnetic coupling transformer 2 is intentionally set at 1:6 in the present invention. Therefore operation can be performed with the driving duty ratio set extremely low. It is clear from FIG. 8B that lowering the driving duty ratio results in a correspondingly low power consumption. Thus, in the present embodiment, the turns ratio of the electromagnetic coupling transformer 2 is set higher than normal (increased twofold in the present example), whereby power consumption is correspondingly reduced.

Description has been made thus far of performing both low power consumption driving and proper boosting by the electromagnetic coupling transformer 2. Brief description will next be made of miniaturization.

The switch circuit 3 (H-bridge output part) of the circuit shown in FIG. 6 is an example of the circuit formed by combining the PMOS transistors P1 and P2 and the NMOS transistors N1 and N2. Such a circuit does not necessarily need to be formed by mounting discrete electronic parts on a circuit board, and can be formed within some IC.

Because the current flowing through the primary winding W1 of the electromagnetic coupling transformer 2 is on the order of a few ten mA, the windings of the electromagnetic coupling transformer 2 do not necessarily have a large wire diameter. In addition, because magnetic flux density within a core is not high, the cross-sectional area of the core can be reduced.

There have recently been sheet-shaped windings provided with a wiring pattern formed by plating or a deposition process with the windings as film. A small multi-winding transformer can be formed by laminating these windings. A small multi-winding transformer can thereby be realized.

According to the present embodiment described above, a piezoelectric element driving circuit that is suitable for a portable device, has a large size, and consumes low power can be realized.

Second Embodiment

In a second embodiment, a stop controlling circuit is added to the driving circuits according to the first embodiment.

Figure 10:
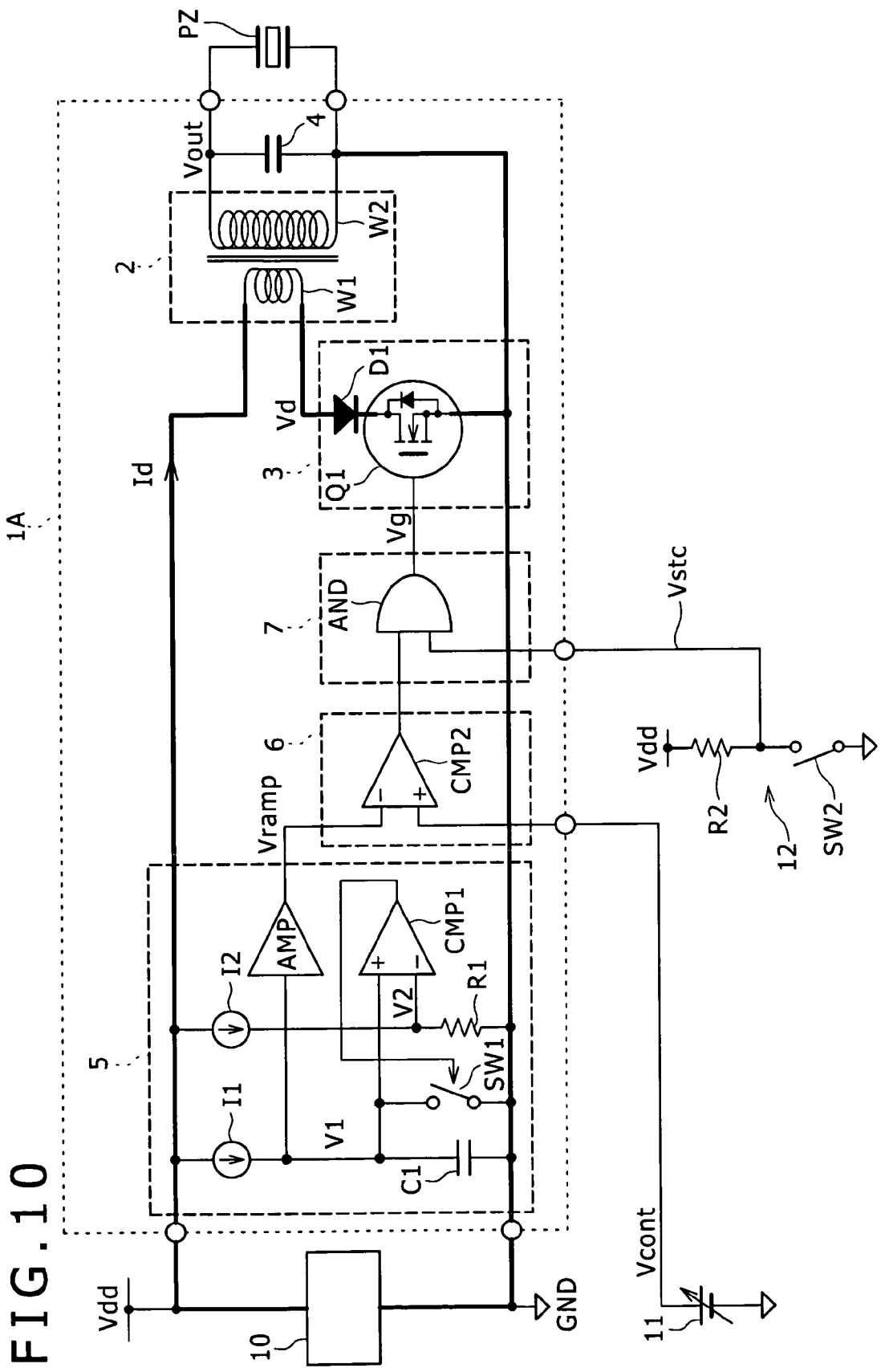
FIG. 10 is a concrete circuit diagram of a unipolar type driving circuit according to the second embodiment.

FIG. 9A and FIG. 9B are block diagrams showing a stop controlling circuit (STC) 7 added to each of FIG. 1A and FIG. 1B. FIG. 10 is a more detailed circuit diagram as with FIG. 2 for FIG. 1A.

As shown in FIG. 9A and FIG. 9B, driving circuits 1A and 1B according to the present embodiment have a stop controlling circuit 7 for periodically stopping a driving pulse input to a switch circuit 3. The stop controlling circuit 7 may be configured to periodically stop the generation of the driving pulse in a pulse generating circuit 5. In this case, however, the stop controlling circuit 7 is provided between a duty ratio controlling circuit 6 and the switch circuit 3, and is configured to enable or disable the driving pulse from the duty ratio controlling circuit 6 for a predetermined period. The length and cycle of the predetermined period are arbitrary, and are determined by a stop controlling signal Vstc externally supplied to the driving circuits 1A and 1B. A circuit for generating the stop controlling signal Vstc may be provided, or the stop controlling signal Vstc may be generated by a CPU or the like.

When the stop controlling circuit 7 is provided between the duty ratio controlling circuit 6 and the switch circuit 3, the stop controlling circuit 7 can be formed by one AND circuit AND, as shown in FIG. 10, for example.

One input of the AND circuit AND is connected to a comparator CMP2 forming the duty ratio controlling circuit 6. The stop controlling signal Vstc is applied to another input of the AND circuit AND. In FIG. 10, the stop controlling signal Vstc is generated by a stop controlling signal generating circuit 12. The stop controlling signal generating circuit 12 is configured such that a resistance R2 and a switch SW2 are connected in series with each other between a power supply voltage Vdd and a ground voltage GND and the second switch SW2 is controlled by for example a CPU not shown in the figure or the like. A command of the CPU or the like determines the off time (driving pulse enabling period) and the on time (driving pulse disabling period) of the second switch SW2 and the cycle (control timing) of the switching.

When the inputting of the driving pulse to the switch circuit 3 is stopped for an arbitrary period in operation in which switching operation is performed, an operation of compensating for energy lost due to a copper loss of a resonant circuit (winding circuit) or the like by intermittent current driving from the primary side of a electromagnetic coupling transformer 2 is stopped. Therefore, the longer the stop period is, the lower the input power becomes. Thus the vibration energy of a piezoelectric element PZ is also decreased. That is, the stop controlling circuit 7 can adjust the operation (vibration energy or average vibration amplitude) of the piezoelectric element PZ by stopping the inputting of the driving pulse to the switch circuit 3 for an arbitrary period.

In a case where the piezoelectric element PZ is used in a pump device that pumps a fluid for water cooling or air cooling (see a third embodiment), for example, the CPU or the like may changeably determine the pulse cycle of the stop controlling signal Vstc according to some detected physical quantity such as the temperature of a subject to be cooled. In this case, the driving pulse is stopped periodically and in such a manner as to be adapted to the state of the subject to be cooled. Thus the frequency of power application in periodic short-duration application of power to the piezoelectric element PZ is decreased. As a result, the input power as a time average can be lowered to a necessary amount.

Figure 11:
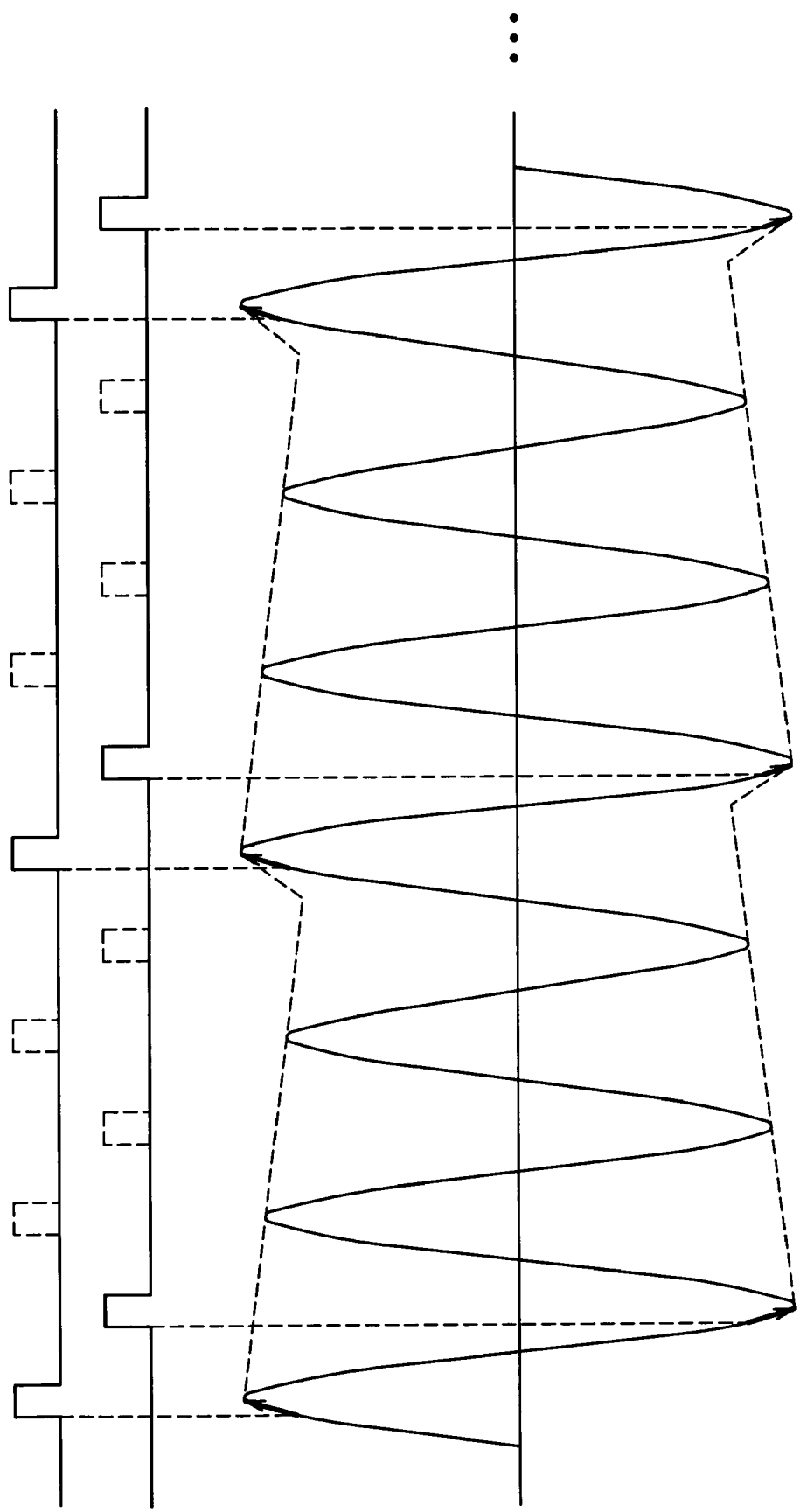
FIG. 11 is a diagram showing an oscillation waveform at a time of stop control in the circuit of FIG. 9A.

FIG. 11 is a graph showing, in a time-compressed manner, the waveform of FIG. 7E or FIG. 7F when stop control is performed by the stop controlling circuit 7 shown in FIG. 9A.

In the case of this waveform, as an example, a stop period is set to m times (three times in this case) the cycle of resonance frequency, and the frequency of generation of the driving pulse at each of the input A and the input B is reduced to once every m times (three times in this case). Thus, during a stop time during which the driving pulse is omitted, boosting as indicated by arrows is not performed, so that the amplitude of the oscillation waveform gradually decreases due to a copper loss or the like. Then the application of a next driving pulse restores the attenuated waveform amplitude.

Third Embodiment

The present embodiment illustrates a pump device as an example of application of a driving circuit. The pump device according to the present embodiment is widely applicable as a pump device for fluids such as air and other gases, liquids and the like. In this case, in particular, an air pump device applicable to an air cooling device for air-cooling a heat generating subject to be air-cooled (an electronic device such as an IC, for example), a device for producing a constant air flow in a thin tube, or the like will be described as an example.

Figure 12:
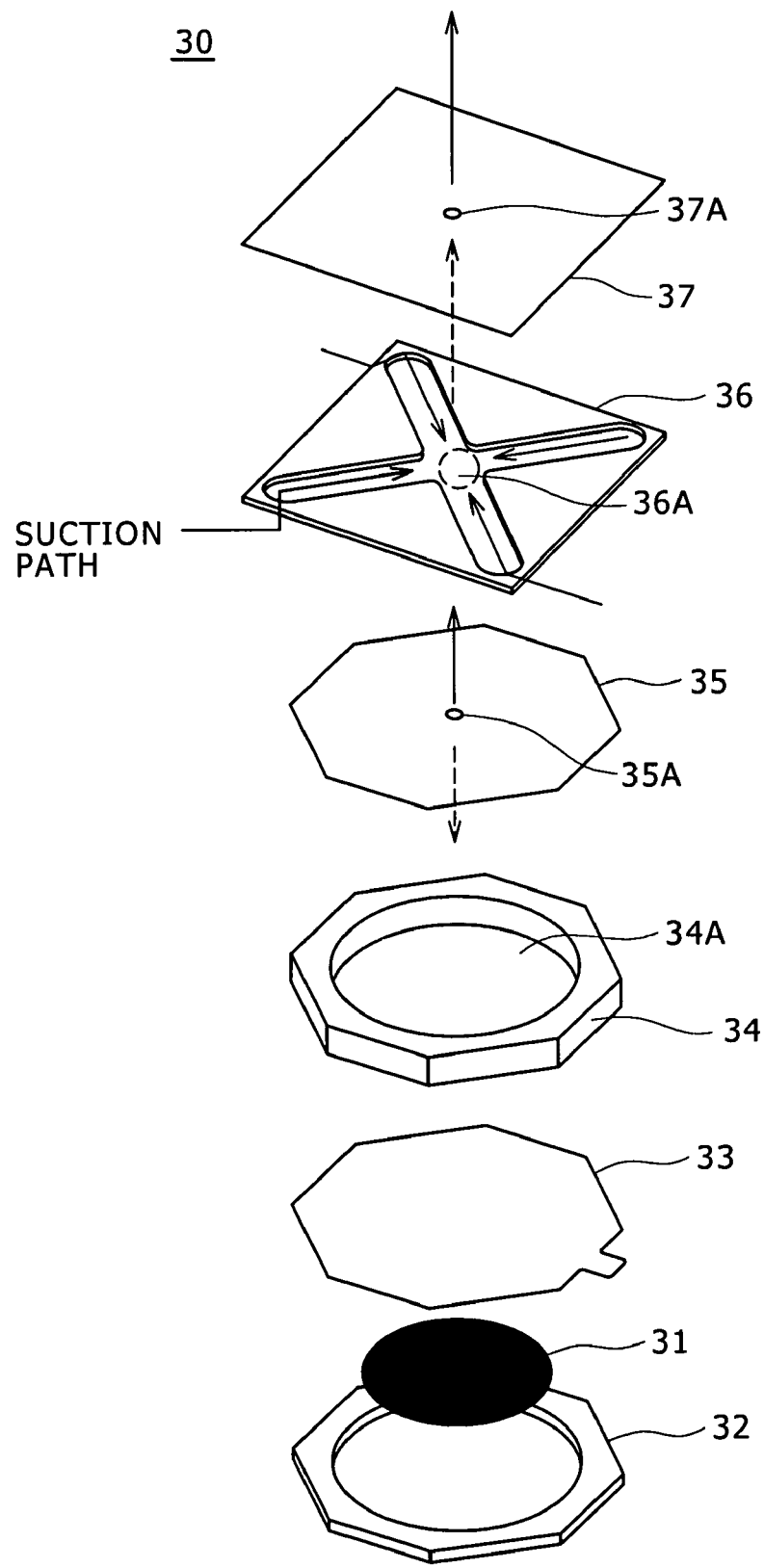
FIG. 12 is an assembly diagram of an air pump device used as an air cooling device according to a third embodiment.

FIG. 12 is an assembly diagram of an air pump device used as an air cooling device.

The illustrated air cooling device (air pump device) 30 includes a piezoelectric material unit 31 as a piezoelectric element, a protective ring 32, a diaphragm 33, a first spacer 34, an intermediate plate 35, a second spacer 36, and a top plate 37.

The protective ring 32 is made of a material resistant to corrosion and having high stiffness such as stainless steel, for example. The protective ring 32 is formed in the shape of a ring for securing an internal space. The piezoelectric material unit 31 is housed inside the protective ring 32. A non-vibrating part of the piezoelectric material unit 31 is fixed to the protective ring 32. The first spacer 34 is superimposed on the protective ring 32 with the diaphragm 33 interposed between the first spacer 34 and the protective ring 32.

The first spacer 34 is made of a material resistant to corrosion and having high stiffness such as stainless steel, for example. The first spacer 34 is formed in the shape of a ring such that the internal space of the first spacer 34 is a pump chamber 34A.

The diaphragm 33 is a kind of vibrating member that vibrates in accordance with the vibration of the piezoelectric material of the piezoelectric material unit 31. A material that is thin and freely changeable in shape but has high strength is used for the diaphragm 33. In addition, the diaphragm 33 has a function of enhancing airtightness at a contact surface in contact with the first spacer 34.

The intermediate plate 35 having a small communicating opening 35A made in a center thereof is superimposed on the upper surface of the first spacer 34. The intermediate plate 35 and the first spacer 34 are fixed to each other so as to enhance airtightness at the contact surfaces of the intermediate plate 35 and the first spacer 34. The pump chamber 34A thus communicates with the outside through the communicating opening 35A. Hence, when the piezoelectric material of the piezoelectric material unit 31 vibrates and the diaphragm 33 moves up and down, the inner volume of the pump chamber 34A is increased and decreased repeatedly, so that an air comes in and goes out through the communicating opening 35A at high speed.

Further, the second spacer 36 and the top plate 37 made of a material resistant to corrosion and having high stiffness such as stainless steel, for example, are fixed to the intermediate plate 35 so as to enhance airtightness at the close contact surfaces of the intermediate plate 35, the second spacer 36, and the top plate 37.

The second spacer 36 has an internal space (four passages) for securing air suction paths from four sides, for example. Ends of the four passages are substantially closed, while small suction openings are made at the ends of the four passages. In addition, an air discharge opening 37A is made in the center of the top plate 37. Therefore, a Venturi nozzle part 36A communicating with the discharge opening 37A and the communicating opening 35A is formed in the central part of the second spacer 36.

Figure 13A:
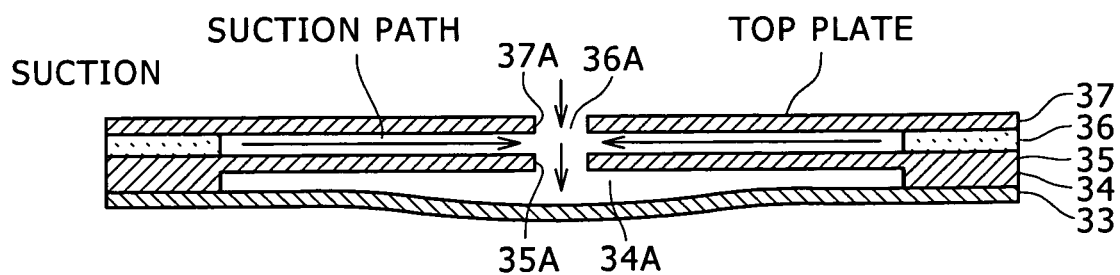
FIGS. 13A to 13C are diagrams showing air paths of an air pump device, FIG. 13A being a schematic sectional view of the air pump device, showing an air path at a time of a suction, FIG. 13B being a schematic sectional view of the air pump device, showing an air path at a time of a discharge, and FIG. 13C being a diagram showing an air flow when the air pump device is viewed at an angle.
Figure 13B:
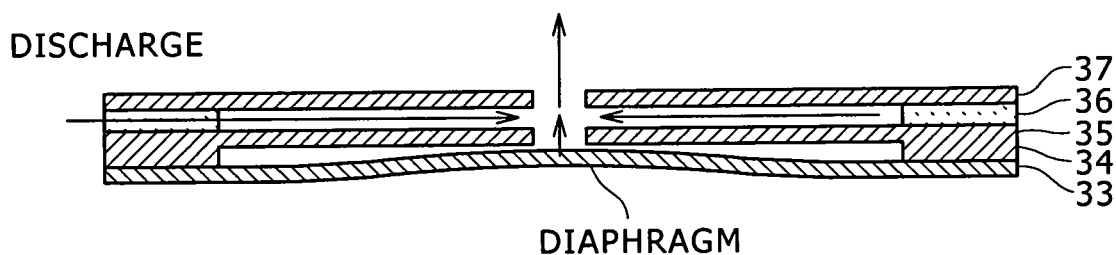

FIG. 13A and FIG. 13B are schematic sectional views showing air paths. FIG. 13A shows an air path at a time of a suction. FIG. 13B shows an air path at a time of a discharge.

When the diaphragm 33 is slowly moved up and down by the piezoelectric material unit 31, a suction increases the volume of the pump chamber 34A, and causes an air to come in from the outside through the path shown in FIG. 13A. In addition, a discharge decreases the volume of the pump chamber 34A, and causes the inside air to be swiftly discharged from the discharge opening 37A through the communicating opening 35A and the Venturi nozzle part 36A as shown in FIG. 13B.

When the suction and the discharge are repeated at high speed (at a frequency of 20 kHz or higher), a continuous air flow at a substantially constant pressure spouts from the discharge opening 37A. In this high-speed driving, the discharge opening 37A does not become an air suction opening as in FIG. 13A, but functions as a discharge opening. Therefore the air suction is performed through the space of the suction paths on four sides which space is formed in the second spacer 36 shown in FIG. 12 and small holes (suction openings) at the ends of the suction paths.

Figure 13C:
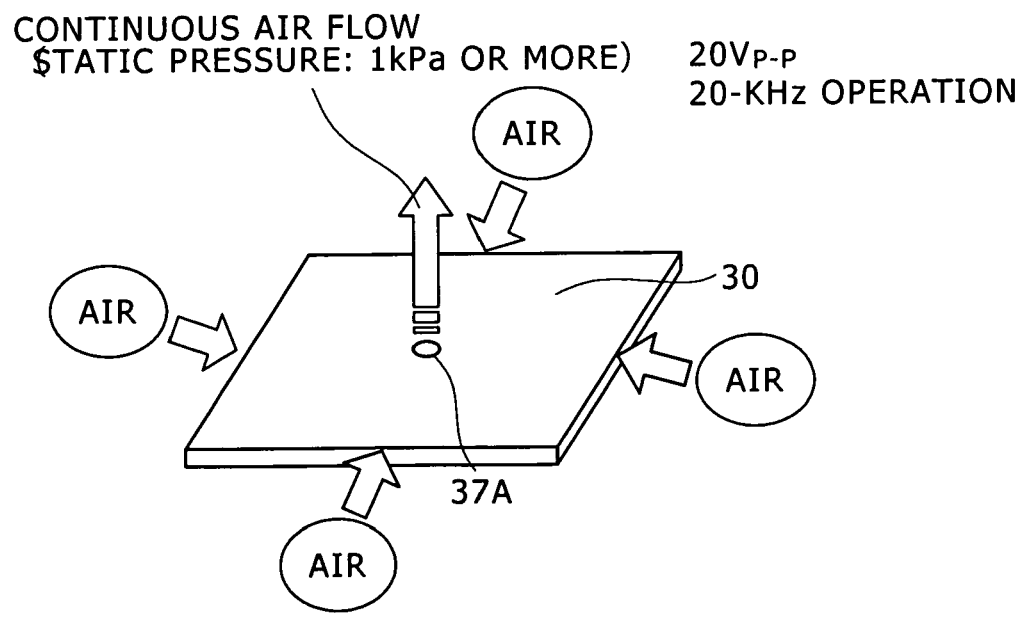

FIG. 13C is a diagram showing an outline of an air pump device 30 suitable as a cooling device and an air path at a time of operation.

The air pump device 30 can be used as a small air cooling device having an upper surface width of about 20 mm and a thickness of about 1 mm. The driving circuit of FIG. 6 already described in the first embodiment is used. In a case of driving at 20 Vp-p and 20 kHz, the static pressure of the continuous air flow spouted from the discharge opening 37A is 1 kPa or higher.

Incidentally, the duty ratio controlling circuit 6 shown in FIG. 1A, FIG. 1B, FIG. 2, FIG. 9A, FIG. 9B, and FIG. 10 can also be realized by a CPU or the like that controls an electronic device including the air pump device 30. In this case, it is desirable that detection mechanism such as a temperature sensor, for example, be disposed on the surface or on the periphery of a subject to be cooled, and that the CPU adaptively change a driving duty ratio automatically according to a detected temperature obtained from the detection mechanism. Alternatively, in a system that needs to increase a flow rate according to the passage of time from the turning on of power, a control may be performed such that the air flow rate is increased by gradually raising the driving duty ratio.

Further, in a case where the stop control of the second embodiment is applied to the third embodiment, as m is increased, average waveform amplitude is decreased, the vibration energy of the piezoelectric element PZ is correspondingly decreased, and a continuous air flow rate (static pressure) per unit time is also decreased. Thus, the output of the air pump device can be controlled by changing a stop period.

The above description has been made of an example in which a low power consumption driving circuit according to an embodiment of the present invention is applied to an air pump device suitable for air cooling. However, the scope of application of the present invention is not limited to air cooling, and the present invention can be applied to pump devices that give a certain flow rate to a cooling liquid medium (such as water or the like) within piping for the cooling medium. In addition, the present invention can be applied to dust removing devices that remove dust by giving vibration to an image pickup element or the like and actuators that generate other vibrations.

Further, piezoelectric element driving circuits according to embodiments of the present invention can be applied to devices that provide a click feeling to a touch sensor of a screen of a liquid crystal display device or the like and piezoelectric motors utilizing opposite-phase driving because opposite-phase driving output can be obtained simultaneously with in-phase driving output by increasing the secondary side winding circuit of the electromagnetic coupling transformer 2 to two circuits without increasing the switch circuit 3.

It should be understood by those skilled in the art that various modifications, combinations, sub-combinations and alterations may occur depending on design requirements and other factors insofar as they are within the scope of the appended claims or the equivalents thereof.

What is claimed is:

1. A piezoelectric element driving circuit comprising:
   a transformer having a turns ratio at which a rate of a number of turns of a secondary winding on a load side is high with respect to a number of turns of a primary winding on a power supply side, exceeding a ratio of a power supply side voltage value to a specification voltage value on the load side;
   a switch circuit for performing switching operation on power supply voltage at a driving frequency on a primary side of said transformer to apply a driving voltage to a piezoelectric element connected to a secondary side of said transformer;
   a reactance element connected in parallel with said piezoelectric element on one of the primary side and the secondary side of said transformer, the reactance element forming a resonant circuit that performs parallel resonance at said driving frequency with a capacitance component in an equivalent circuit of said piezoelectric element and an inductance component of said transformer;
   a pulse generating circuit for generating a driving pulse for said switch circuit; and
   a duty ratio controlling circuit for being supplied with said driving pulse, limiting a duty ratio of said driving pulse such that a value of said driving voltage falls within a range equal to or lower than the specification voltage value on said load side, and outputting the driving pulse whose duty ratio is limited to said switch circuit.

2. The piezoelectric element driving circuit according to claim 1, further comprising
   a stop controlling circuit for periodically stopping the switching operation of said switch circuit for an arbitrary period.

3. A pump device comprising:
   a pump having a pump chamber one side of which is sealed by one of a piezoelectric material of a piezoelectric element and a vibrating member vibrating together with said piezoelectric material, the pump discharging, from a discharge opening, a fluid sucked in from a fluid suction opening of said pump chamber; and
   a driving circuit for vibrating and driving said piezoelectric element of said pump;
   wherein said driving circuit includes
      a transformer having a turns ratio at which a rate of a number of turns of a secondary winding on a load side is high with respect to a number of turns of a primary winding on a power supply side, exceeding a ratio of a power supply side voltage value to a specification voltage value on the load side,
      a switch circuit for performing switching operation on power supply voltage at a driving frequency on a primary side of said transformer to apply a driving voltage to a piezoelectric element connected to a secondary side of said transformer,
      a reactance element connected in parallel with said piezoelectric element on one of the primary side and the secondary side of said transformer, the reactance element forming a resonant circuit that performs parallel resonance at said driving frequency with a capacitance component in an equivalent circuit of said piezoelectric element and an inductance component of said transformer,
      a pulse generating circuit for generating a driving pulse for said switch circuit, and
      a duty ratio controlling circuit for being supplied with said driving pulse, limiting a duty ratio of said driving pulse such that a value of said driving voltage falls within a range equal to or lower than the specification voltage value on said load side, and outputting the driving pulse whose duty ratio is limited to said switch circuit.

4. The pump device according to claim 3,
   wherein said driving circuit further includes a stop controlling circuit for periodically stopping the switching operation of said switch circuit for an arbitrary period.

* * * * *